United States Patent [19]

Watrous et al.

[11] 4,316,185
[45] Feb. 16, 1982

[54] BATTERY MONITOR CIRCUIT

[75] Inventors: Donald L. Watrous, Liverpool; Richard C. Weischedel, Camillus, both of N.Y.

[73] Assignee: General Electric Company, Schenectady, N.Y.

[21] Appl. No.: 169,738

[22] Filed: Jul. 17, 1980

[51] Int. Cl.³ .................. G08B 21/00; H03K 5/153
[52] U.S. Cl. .................... 340/636; 320/48; 324/433; 324/434; 328/148; 340/661; 307/362
[58] Field of Search .............. 340/636, 661, 663; 320/48; 324/434, 431, 429, 433; 328/148, 146, 147; 307/355, 356, 357, 360, 361, 362, 364

[56] References Cited

U.S. PATENT DOCUMENTS 3,808,534  4/1974  Summers et al. .............. 340/636 X
4,134,060  1/1979  Feldman .......................... 324/434

FOREIGN PATENT DOCUMENTS 1262016  2/1972  United Kingdom ................ 324/433

Primary Examiner—John W. Caldwell, Jr.
Assistant Examiner—Daniel Myer
Attorney, Agent, or Firm—Alexander M. Gerasimow; James C. Davis; Marvin Snyder

[57] ABSTRACT

A battery monitor circuit for rechargeable multicell batteries that provides a reliable indication of battery failure independent of temperature, load and age, by continuously comparing the impedance of the cells of the battery against each other. Comparison means are provided responsive to a first voltage at a tapped terminal of the battery that divides the battery cells into two groups, and to a second voltage that represents a fraction of the battery voltage corresponding to the ratio of the number of cells in each group, said comparison means generating an error signal when said first and second voltages change so as to experience a reversal in relative magnitude, which is indicative of cell deterioration.

6 Claims, 2 Drawing Figures

BATTERY MONITOR CIRCUIT

BACKGROUND OF THE INVENTION

The invention pertains to monitor circuits for rechargeable multicell battery packs.

Rechargeable batteries are widely used in standby power applications to provide temporary service during power outages and the like. Typical applications are to industrial emergency lighting systems, fire alarm systems, burglar alarms and computer systems. Because it is extremely important that the batteries operate reliably when called upon, monitor circuits are often employed for monitoring their condition and for providing an indication of any battery malfunction, should that occur. These monitor circuits normally merely sense the battery output voltage to detect when it falls below a given value. However, this is often not an accurate measure of battery condition since the output voltage of rechargeable batteries varies with such factors as temperature, load and age. In particular individual battery cells may be in a partially or completely deteriorated condition and yet not sufficiently affect the output voltage so as to be detectable by conventional circuits.

SUMMARY OF THE INVENTION

It is accordingly an object of the invention to provide a novel and improved battery monitor circuit for rechargeable multicell battery packs which detects battery condition with extreme accuracy and reliability.

It is another object of the invention to provide a novel and improved battery monitor circuit which detects numerous defective conditions with respect to a rechargeable multicell battery pack.

It is a further object of the invention to provide a novel and improved battery monitor circuit capable of detecting the presence of a partially or completely defective cell within a rechargeable multicell battery pack.

It is yet a further object of the invention to provide a novel and improved battery monitor circuit as above described which is of relatively simple circuit design and low cost.

The present invention takes into account the fact that cells within a rechargeable battery pack are closely matched in their manufacture and under identical conditions will exhibit the same voltage, to within a few millivolts. When a cell deteriorates its load characteristics or impedance changes and it eventually becomes a shorter or open cell. By continuously comparing the cells against each other, the overall battery condition can be determined independent of the effects of temperature, age and load, and often in the incipient stages of battery failure.

Accordingly, the above recited and other objects of the invention, in accordance with one aspect thereof, are accomplished by a battery monitor circuit for a multicell rechargeable battery having a high voltage terminal and a reference terminal at opposite ends and an intermediate terminal that divides the cells of the battery into two groups, comprising resistive voltage divider means for providing a first signal of voltage magnitude in a range corresponding to the ratio of the number of cells within said two groups when coupled across the battery's high voltage and reference terminals. Means coupled to said intermediate terminal provides a second signal of voltage magnitude corresponding to the voltage between said intermediate and reference terminals, and comparison means responsive to said first and second signals generates an error signal upon a signal change sufficient to cause reversal of the relative voltage magnitude of said first and second signals, which is indicative of battery cell deterioration.

In accordance with a more specific aspect of the invention, at any given instant said first signal is composed of first and second voltage magnitudes which define the limits of said range, said second signal is composed of a third voltage magnitude, said first and second voltage magnitudes being nominally offset to either side of said third voltage magnitude, and said comparison means comprises a first comparator network responsive to said first and third voltage magnitudes and a second comparator network responsive to said second and third voltage magnitudes. In addition, said voltage divider means comprises a series resistance divided into first and second large resistance components joined by a relatively small third resistance component, said first voltage magnitude being derived from the junction of said first and third resistance components and said second voltage magnitude being derived from said second and third resistance components, whereby said error signal is generated when the input voltages to either of said first or second comparator networks change sufficiently so as to experience a reversal in relative magnitude.

In accordance with a further aspect of the invention, there is provided further comparison means responsive to a reference signal of reference voltage magnitude and a further signal of voltage magnitude in a range that is a function of the voltage across all the cells of said battery for providing a further error signal when the voltage magnitudes of said reference and further signals experience a reversal in relative value, which is indicative of a multiple cell failure.

BRIEF DESCRIPTION OF THE DRAWINGS

While the specification concludes with the claims which particularly point out and distinctly claim that subject matter which is regarded as inventive, it is believed the invention will be more clearly understood when considering the following detailed description taken in connection with the accompanying figures of the drawings, in which:

DESCRIPTION OF THE PREFERRED EMBODIMENTS

Figure 1:
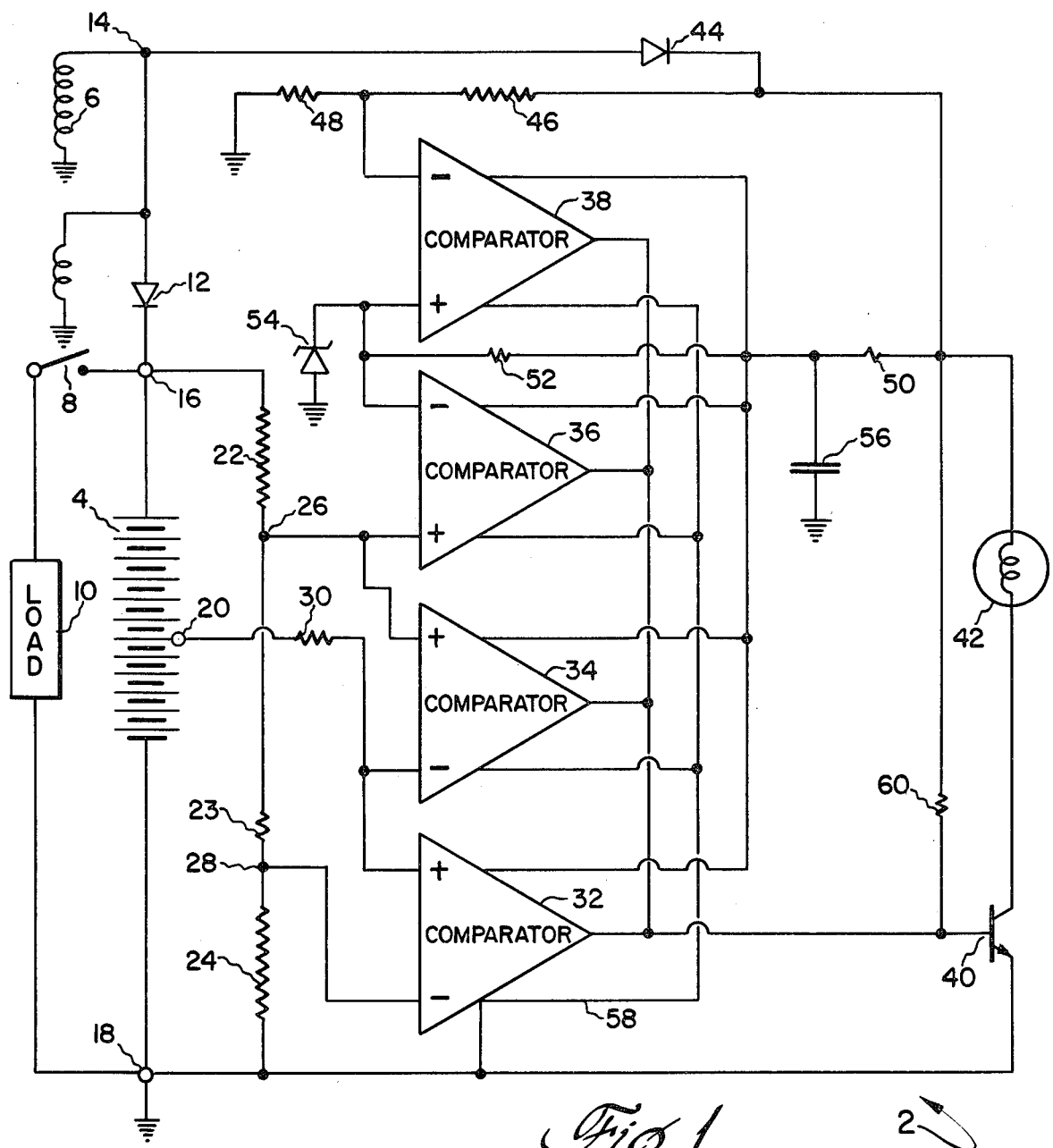
FIG. 1 is a schematic circuit diagram of a battery monitor circuit, in accordance with the invention.

With reference to FIG. 1, there is illustrated a battery monitor circuit 2 for a multicell rechargeable battery pack 4 employed for standby power, which circuit detects various defective conditions of the battery so as to ensure a reliable operation when the battery is called into service due to interruption of power from the normal source of supply, denoted by transformer winding 6. As illustrated in the drawing, upon power interruption the normally open relay contacts 8 close for connecting the battery across a load 10 that may be an emergency light or take any number of other forms for which standby battery power is useful.

The battery 4 is composed of multiple cells, typically twelve in number, which are closely matched in their manufacture so as to exhibit the same voltage to within several millivolts under identical test conditions. In the exemplary embodiment under consideration, a nickel-cadmium battery was employed, although for purposes of the invention any rechargeable multicell battery providing an accessible intermediate voltage tap or taps may be employed. When a battery cell deteriorates its load characteristic or impedance changes, either decreasing toward an eventual short circuit, or increasing toward an eventual open circuit. The impedance of a cell, as the term is used herein, may be defined as the cell voltage divided by cell current. As will be seen, the present monitor circuit 2 detects the deterioration of one or more cells prior to the occurrence of a substantially shorted or open condition.

Charging current is supplied to the battery through a diode 12 connected in the forward poled direction between power supply terminal 14 and the high voltage terminal 16 of battery 4, which also has a ground terminal 18 and an intermediate terminal 20. The terminal 20 divides the cells of the battery into two groups. It is preferable that terminal 20 be situated so as to provide a relatively balanced grouping of the cells, and that in the normal condition the voltage across a single cell is a substantial fraction of the total voltage across its group of cells, e.g., no less than 1/10, so that any change in cell impedance is readily detectable. In the present example, terminal 20 is a center tap placing half the total number of cells in each of the upper and lower groups, although for purposes of the invention other intermediate terminal taps may be employed. A resistive voltage divider composed of serially connected resistors 22, 23 and 24 is connected across the battery between terminals 16 and 18. Resistors 22 and 24 are more than an order of magnitude greater than resistor 23, and in the present example are of equal value. A terminal 26 is at the junction of resistors 22 and 23, and a terminal 28 at the junction of resistors 23 and 24. Resistors 22 and 24 serve to divide the battery voltage in accordance with the ratio of the number of cells within the two groups. Resistor 23 is an offset resistor that serves to provide a narrow range of voltages or threshold window, about the nominally divided voltage. Thus, for a battery in satisfactory condition, the voltages at terminals 26 and 28 are slightly higher and slightly lower, respectively, then half the battery voltage, which is at terminal 20.

Terminal 20 is coupled through an impedance matching resistor 30 to the positive input of a first comparator network 32 and to the negative input of a second comparator network 34. Terminal 28 is applied to the negative input of comparator 32, and terminal 26 is applied to the positive input of comparator 34. As will be further described, comparators 32 and 34 respond to the deterioration of one or more cells to change output state from a normal high impedance output state to a low impedance output state. Also included in the monitor circuit are comparator networks 36 and 38 which respond to conditions of two similarly deteriorated cells in each group of the battery pack, or abnormally high or low battery output voltage. The comparator networks are conventional circuit components for generating one of two digital output signals in response to the relative magnitude of a pair of input signals. The outputs of comparators 32, 34, 36 and 38 are connected in an OR configuration and coupled to the base of an NPN transistor 40. The emitter of transistor 40 is connected to ground and the collector is connected through a monitor lamp 42 and forward poled diode 44 to power supply terminal 14. For a normal operation, transistor 40 conducts and lamp 42 will be on. When any one of the comparators changes output state in response to an abnormal condition, which bypasses the base drive current, or should the power fail, transistor 40 is made nonconducting and the monitor lamp goes out.

Diode 44 is further coupled through a resistive voltage divider of serially connected resistors 46 and 48 to ground, the function of these resistors being applied to the negative input of comparator 38. Diode 44 is also coupled through a resistive voltage divider of serially connected resistors 50 and 52 and through zener diode 54 to ground, the junction of the zener diode and resistor 52 being applied to the positive input of comparator 38. The junction of resistors 50 and 52 is coupled through a noise filtering capacitor 56 to ground and to each of the comparators for enabling these components, which in the present exemplary embodiment are enabled only during the charge cycle by virtue of the operation of diodes 12 and 44. A conductor 58 provides a ground connection for each of the comparators. Finally, a current limiting resistor 60 is connected between the diode 44 and the base of transistor 40, resistor 60 supplying base drive current for turning on the transistor. While there is some advantage regarding current identification in operating the circuit only during the charge cycle, for purposes of the invention the circuit may be modified to operate in the discharge cycle with comparable results.

Figure 2:
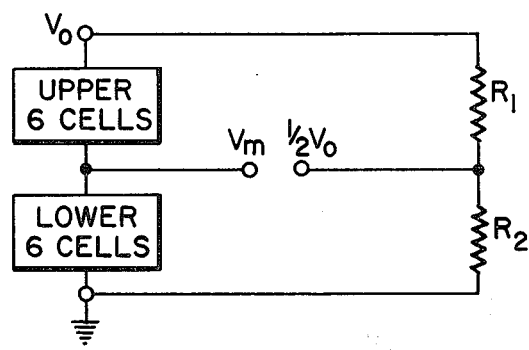
FIG. 2 is a simplified schematic diagram useful in explaining the operation of the circuit of FIG. 1.

In operation of the battery monitor circuit of FIG. 1, under normal conditions with the battery 4 is satisfactory condition and a proper voltage applied to the battery by the power supply, the comparators are all in their normal high impedance output stage for supplying a signal to the base of transistor 40 that allows base drive current from resistor 60 to maintain this transistor in a conductive mode, lighting the monitor lamp 42. In the present example, the battery is assumed to have 1.3 volts per cell between 0° C. and 70° C., generating 15.6 volts across terminals 16 and 18. Referring to FIG. 2, which is a simplified representation of the battery and its parallel resistive voltage divider network of equal resistors $R_1$ and $R_2$, under normal conditions the output battery voltage $V_o$ is 15.6 volts, the voltage $V_m$ at the center tap is 7.8 volts and the voltage $\frac{1}{2}V_o$ at the junction of resistors $R_1$ and $R_2$ is also 7.8 volts. Should a cell become shorted, $V_o$ will drop in voltage by 1.3 volts and $\frac{1}{2}V_o$ will drop by 0.65 volts. If the shorted cell is one of the lower cells $V_m$ will drop by 1.3 volts, and if one of the upper cells $V_m$ will remain the same. In either case, however, $V_m$ no longer equals $\frac{1}{2}V_o$. As will be seen, it is this inequality that triggers the response of comparators 32 and 34. Similarly, if a cell substantially increases in impedance, $\frac{1}{2}V_o$ will increase by a certain amount and $V_m$ will increase by twice this amount or remain the same, depending upon the deteriorating cell being one of the lower or upper cells, respectively. It may also be noted at this point that for the rare occurrence of where there should develop an equal deterioration of cells in both the upper and lower cells, such as a shorted cell in each, the equality between $V_m$ and $\frac{1}{2}V_o$ is not upset. In such case one of comparators 36 and 38 is made to function, as will be described subsequently.

The resistor 23 of the resistive voltage divider across battery 4 provides an acceptable threshold window for operation of the comparators 32 and 34. The value of this resistor relative to that of resistors 22 and 24 determines the sensitivity of the circuit, or width of the window, and depends on the number of cells in the battery pack and the voltage drop across each cell. With circuit variations and cell mismatch held to under 0.10 volts, a threshold window of between 0.10 and 0.55 volts may be used. In the present example, for normal conditions the voltage at terminal tap 20 is 7.8 volts, with a window of ±0.275 volts which provides good immunity to circuit variation and readily detects a 50% change in any cell impedance. This window value is provided by proportioning the resistance of resistor 23 to that of equal resistors 22 and 24 by approximately 1:13.5. Accordingly, the voltage at terminal 28, which is applied to the negative input of comparator 32, is 0.275 volts less than the voltage at terminal 20, which is applied to the positive input of comparator 32. Correspondingly, the voltage at terminal 26, which is applied to the positive input of comparator 34, is 0.275 volts greater than the voltage applied to the negative input from terminal 20.

Should a cell between terminals 20 and 18 short, the voltage at terminal 20 will drop by 1.3 volts and the voltage at terminals 26 and 28 will drop by 0.65 volts. This causes comparator 32 to change to its low impedance output state by virtue of a reversal in relative magnitude of voltages at the inputs, with the positive input dropping below the negative input, so as to turn off transistor 40 and monitor lamp 42. Should a cell between terminals 16 and 20 short, the voltage at terminal 20 does not change while the voltages at terminals 26 and 28 drop by 0.65 volts. This causes comparator 34 to change to its low impedance output state by virtue of a reversal in relative magnitude of voltage inputs and turn off transistor 40. Correspondingly, should a cell between terminals 20 and 18 substantially increase in impedance so that the voltage drop across the cell increases by 50% of its normal value or more, e.g., by 0.65 volts, the voltage at terminal 20 will increase by this amount and the voltage at terminals 26 and 28 will increase by one half this amount, sufficient to cause comparator 34 to change output state. Should a cell between terminals 16 and 20 substantially increase in impedance to this degree, the voltage at terminal 20 will not change as the voltage at terminals 26 and 28 increases, causing comparator 32 to change output state.

As noted previously, if a shorted cell or high impedance cell develops in both upper and lower groups of the battery cells equal voltage changes occur at terminals 20, 26 and 28 and comparators 32 and 34 will not respond. For the condition of one or more shorted cells in both upper and lower groups of cells, the voltage at terminal 26, which is also connected to the positive input of comparator 36, drops sufficiently so as to fall below the reference voltage of zener diode 54 applied to the negative input, thereby changing the output state of this comparator and turning off transistor 40 and lamp 42. In the present example, the zener diode provides a reference voltage at 1 volt below the nominal voltage at terminal 20. Comparator 36 is also actuated to change output state if the supply voltage falls substantially, i.e., by the amount of two cell voltage drops.

For the condition of one or more high impedance cells in both upper and lower groups of cells, providing a voltage increase of at least twice the voltage of a normal cell, the voltage at the junction of voltage divider resistors 46 and 48, which is applied to the negative input of comparator 38, increases sufficiently so as to exceed the reference voltage of zener diode 54 applied to the positive input so as to change the output state of comparator 38. Comparator 38 is also actuated by the supply voltage increasing substantially.

In the noted exemplary embodiment of the battery monitor circuit 2, the following circuit components and values may be employed, being presented for purposes of clear and complete disclosure and in no sense intended to be limiting of the invention:

| | |
|---|---|
| Resistors 22, 24, 46 | 100 Kohms |
| Resistor 23 | 7.5 Kohms |
| Resistors 30, 48 | 47 Kohms |
| Resistor 50 | 1 Kohm |
| Resistor 52 | 7 Kohms |
| Resistor 60 | 5.6 Kohms |
| Capacitor 56 | .1 µf |
| Transistor 40 | Type 2N2222A |
| Zener Diode | 6.8 v |
| Diodes 12, 44 | Signal diodes |
| Comparators 32, 34, 36, 38 | IC 3302 |

While the invention has been described with reference to a specific embodiment thereof for the purposes of clear and concise disclosure, it should be understood numerous modifications may be made to the present circuit by ones skilled in the art that would not exceed the basic teachings of the invention. For example when considering a battery with numerous cells, in order for the normal cell voltage to be a substantial fraction of the total voltage in its group of cells two or more intermediate terminal taps may be employed for dividing the battery cells into three or more groups, with a resistive voltage divider network and a pair of comparator networks provided for each intermediate terminal tap, the comparators being operated in an OR configuration in accordance with the teaching of the circuit of FIG. 1. For example, for a battery having 24 cells, upper and lower terminal taps may be employed to divide the battery into three groups of eight cells each. A first resistive voltage divider may be placed across the upper and middle group of cells and, with the upper terminal tap, coupled to a first pair of comparators. The second resistive voltage divider may be placed across the middle and lower group of cells and, with the lower terminal tap, coupled to a second pair of comparators. The first and second voltage dividers and comparators are connected in a similar circuit arrangement and function in similar manner to comparators 32 and 34 of FIG. 1. The following claims are intended to include within their meaning the above and all modifications and alternatives of the circuit that fall within the true spirit and scope of the invention.

What we claim as new and desire to secure as Letters Patent of the United States is:

1. A battery monitor circuit for a multicell rechargeable battery having a high voltage terminal and a reference terminal at opposite ends and an intermediate terminal that divides the cells of the battery into two groups comprising:

a. resistive voltage divider coupled across said high voltage and reference terminals, said voltage divider comprising first and second large resistance components joined by a relatively small third resistance component, a first voltage magnitude being derived from the junction of said first and third resistance components, and said second voltage magnitude being derived from the junction of said second and third resistance components, said first and second voltage magnitudes defining the limits of a voltage range;

b. means for coupling to said intermediate terminal so as to provide a third voltage magnitude corresponding to the voltage between said intermediate and reference terminals, said first and second voltage magnitudes being nominally offset to either side of said third voltage magnitude; and c. comparison means including
1. a first comparator network responsive to said first and third voltage magnitudes for detecting battery cell low impedance deterioration in one group of cells and high impedance deterioration in the other group of cells;
2. A second comparator network responsive to said second and third voltage magnitudes for detecting battery cell high impedance deterioration in said one group of cells and low impedance deterioration in said other group of cells;
3. a third comparator network responsive to one of said first or second voltage amplitudes and a reference voltage for detecting battery cell low impedance deterioration in both groups of cells;

said comparison means generating an error signal when the respective input voltage magnitudes to any of said first, second, and third comparator networks experience a reversal in relative magnitude.

2. A battery monitor circuit as in claim 1 in which said comparison means further comprises a fourth comparator network responsive to said reference voltage and to a fourth voltage magnitude proportional to the voltage between said high voltage and reference terminals for detecting battery cell high impedance deterioration in both groups of cells, said comparison means generating an error signal when input voltages to said fourth comparator network experience a reversal in relative magnitude.

3. A battery monitor circuit as in claim 2 wherein said comparator networks have their outputs coupled together and operate in a logic OR configuration.

4. A battery monitor circuit for a multicell rechargeable battery having at least one intermediate terminal that divides the cells of the battery into a plurality of groups, comprising:

a. a resistive voltage divider coupled across a pair of battery terminals at opposite ends of two adjacent groups, said resistive voltage divider comprising a series resistance divided into first and second large resistance components joined by a relatively small third resistance component, a first voltage magnitude being derived from the junction of said first and third resistance components and a second voltage magnitude being derived from the junction of said second and third resistance components, said first and second voltage magnitudes defining the limits of a voltage range;

b. means for coupling to said intermediate terminal so as to provide a third voltage magnitude corresponding to the voltage across one of said two adjacent groups, said first and second voltage magnitudes being nominally offset to either side of said third voltage magnitude;

c. comparison means including
1. a first comparator network responsive to said first and third voltage magnitudes for detecting battery cell low impedance deterioration in one group of said two adjacent groups of cells and high impedance deterioration in the other group of said two adjacent groups of cells;
2. a second comparator network responsive to said second and third voltage magnitudes for detecting battery cell high impedance deterioration in said one group of cells and low impedance deterioration in said other group of cells;
3. a third comparator network responsive to one of said first or second voltage amplitudes and a reference voltage for detecting battery cell low impedance deterioration in both groups of cells;

said comparison means generating an error signal when the respective input voltage magnitudes to any of said first, second, or third comparator networks experience a reversal in relative magnitude.

5. A battery circuit as in claim 4 in which said comparison means further comprises a fourth comparator network responsive to said reference voltage and to a fourth voltage magnitude proportional to the voltage between said pair of battery terminals at opposite ends of said two adjacent groups for detecting battery cell high impedance deterioration in both groups of cells, said comparison means generating an error signal when input voltages to said fourth comparator network experience a reversal in relative magnitude.

6. A battery monitor circuit as in claim 5 wherein said comparator networks have their outputs coupled together and operate in a logic OR configuration.

* * * * *